(12) United States Patent
Lee et al.

(10) Patent No.: US 6,318,451 B1
(45) Date of Patent: Nov. 20, 2001

(54) HEAT SINK FOR INTEGRATED CIRCUIT

(75) Inventors: Chao-Yang Lee, Taipei; Yeu-Lih Lin; Chao Kun Tseng, both of Tu-Chen, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/603,804

(22) Filed: Jun. 26, 2000

(30) Foreign Application Priority Data

Mar. 15, 2000 (TW) ................................................ 089204150

(51) Int. Cl.[7] ....................................................... H05K 7/80
(52) U.S. Cl. ........................................... 165/80.3; 361/704
(58) Field of Search .................................. 165/80.3, 185; 361/704; 257/722

(56) References Cited

U.S. PATENT DOCUMENTS

| | | | |
|---|---|---|---|
| 5,623,394 | * | 4/1997 | Sherif et al. .......................... 361/705 |
| 5,932,925 | * | 8/1997 | McIntyre ............................... 257/719 |
| 5,990,552 | * | 2/1997 | Xie et al. .............................. 257/718 |
| 6,046,906 | * | 9/1998 | Tseng .................................... 361/704 |
| 6,114,761 | * | 1/1998 | Mertol et al. ......................... 257/722 |

\* cited by examiner

*Primary Examiner*—Allen Flanigan
(74) *Attorney, Agent, or Firm*—Wei Te Chung

(57) ABSTRACT

A heat sink includes a base and a number of fins extending from a top face of the base. A groove is defined in a bottom face of the base opposite the fins for receiving a flip chip of a flip chip processor thereby reducing damage to the flip chip during mounting the heat sink to the flip chip processor. At least one elongate protrusion extends from the base for engaging with an edge of a substrate of the flip chip processor to properly position the heat sink with respect to the flip chip processor.

1 Claim, 6 Drawing Sheets

HEAT SINK FOR INTEGRATED CIRCUIT

BACKGROUND OF THE INVENTION

1. Field of the Invention

The present invention relates to a heat sink for an Integrated Circuit, and particularly to a heat sink for a flip chip processor.

2. The Related Art

With new developments in the computer industry, an integrated circuit, such as a flip chip processor, generates a large amount of heat due to its high speed of operation. If the heat accumulates in the integrated circuit, the stability of the computer system may be damaged. To solve this problem, a heat sink is mounted on the integrated circuit to dissipate heat therefrom.

Referring to FIG. 1, a conventional heat sink 10 comprises a heat dissipating base 14 having a flat bottom face (not labeled) and a multiplicity of fins 18 extending from an opposite top face of the base 14. The heat sink 10 is mounted to a flip chip processor 20 with the bottom face engaging the flip chip processor 20.

A flip chip processor 20, as shown in FIG. 2, comprises a substrate 24 on a top face of which a flip chip 22 is formed. When the heat sink 10 is mounted to the flip chip processor 20, a die edge 23 of the flip chip 22 is first contacted by the flat bottom face of the base 14 of the heat sink 10 and then the heat sink 10 is rotated about the die edge 23 to compensate for the height H of the flip chip 22 to form surface contact with the flip chip 22. The rotation of the heat sink 10 about the die edge 23 may cause damage to the die edge 23 of the flip chip 22.

Furthermore, due to the flat bottom surface of the base 14, the heat sink 10 may not be properly positioned on the flip chip processor 20. Relative movement between the heat sink 10 and the flip chip processor 20 may occur.

It is desired to provide a heat sink to solve the above problems.

SUMMARY OF THE INVENTION

Accordingly, an object of the present invention is to provide a heat sink defining a groove for receiving a raised flip chip of a flip chip processor thereby preventing the flip chip from being damaged during mounting the heat sink to the flip chip processor.

Another object of the present invention is to provide a heat sink readily mounted to a flip chip processor.

A further object of the present invention is to provide a heat sink for a flip chip processor prohibiting relative movement therebetween.

To achieve the above mentioned objects, a heat sink in accordance with the present invention comprises a base and a multiplicity of fins extending upward from a top face of the base. A groove is defined in a bottom face of the base opposite the fins for receiving a flip chip formed on a top face of a flip chip processor. At least one elongate protrusion extends from the base for engaging with an edge of a substrate of the flip chip processor to properly position the heat sink with respect to the flip chip processor.

Other objects, advantages and novel features of the present invention will be drawn from the following detailed embodiments of the present invention with attached drawings, in which:

DESCRIPTION OF THE PREFERRED EMBODIMENT

Figure 1:
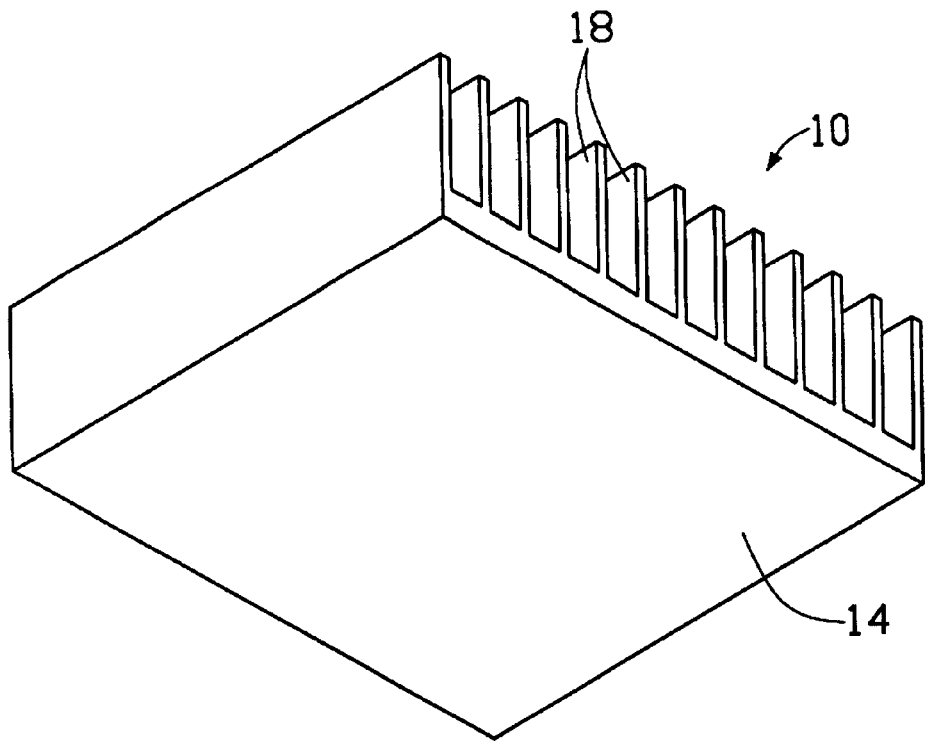
FIG. 1 is a perspective view of a conventional heat sink.
Figure 2:
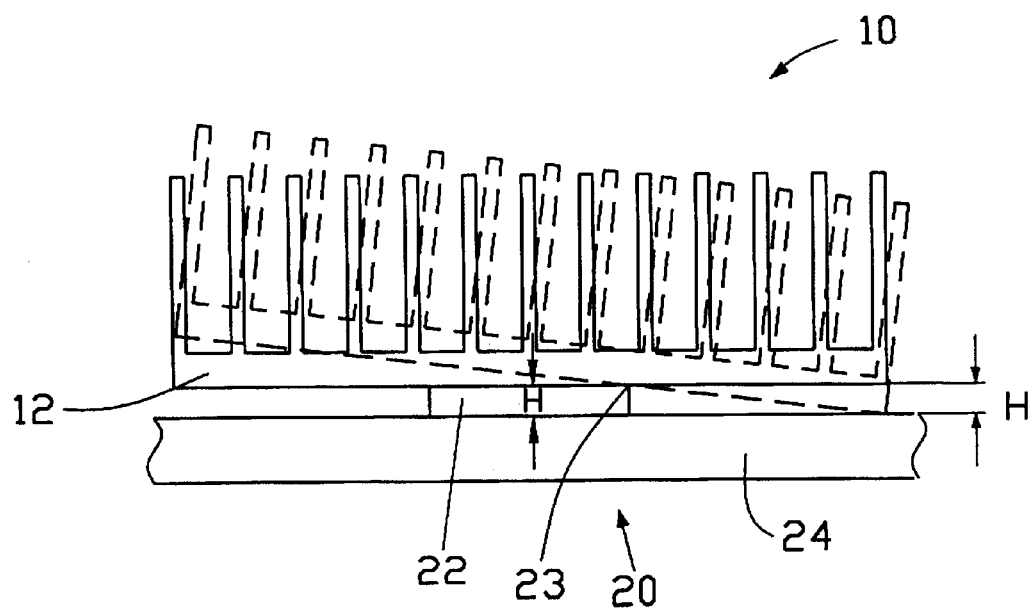
FIG. 2 is a schematic view showing the procedure for mounting the conventional heat sink of FIG. 1 to a flip chip processor.

Throughout the drawings, like parts are designated with like reference numerals for facilitating illustration.

Figure 3:
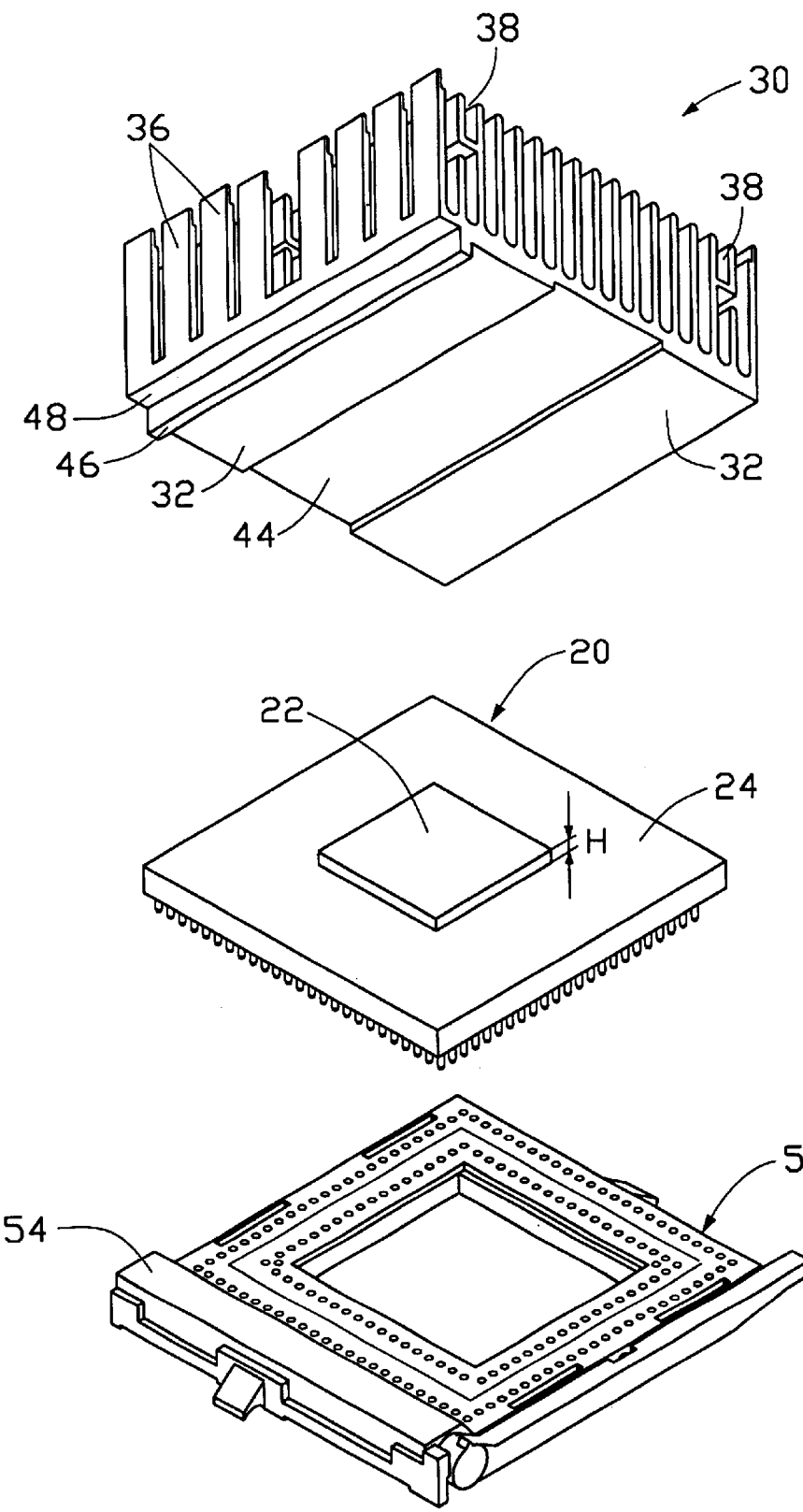
FIG. 3 is an exploded view of a heat sink of the present invention for being mounted to a flip chip processor retained by a socket.
Figure 4:
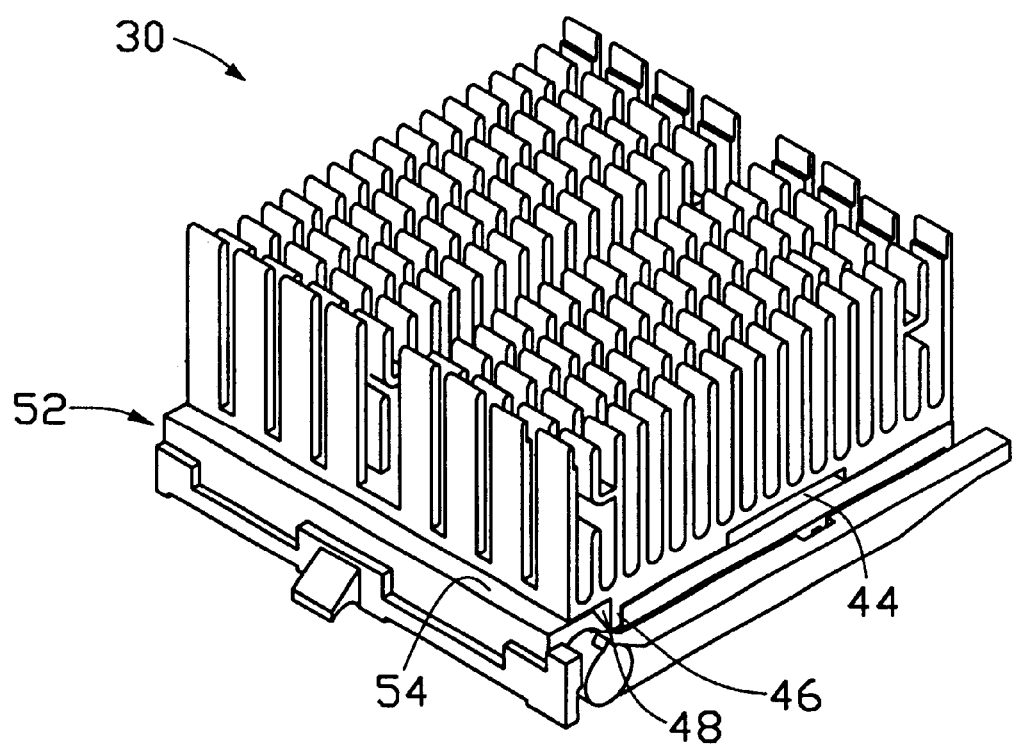
FIG. 4 is an assembled view of FIG. 3.

Referring to FIGS. 3 and 4, a heat sink 30 of the present invention is shown mounted to a flip chip processor 20 retained by a socket connector 52. The heat sink 30 comprises a base 32 having a bottom face and an opposite top face and a multiplicity of fins 36 extending upward from the top face of the base 32. Recesses 38 are defined in the fins 36 for receiving and engaging fasteners (not shown) securing a fan assembly (not shown) to the heat sink 30. A groove 44 is defined in the bottom face of the base 32 opposite the fins 36. An elongate protrusion 46 extends from the bottom face of the base 32 substantially parallel with the groove 44. A cutout 48 is defined in the elongate protrusion 46.

As is known, the flip chip processor 20 comprises a substrate 24 for being retained by the socket 52 and a flip chip 22 formed on the substrate 24.

Figure 5:
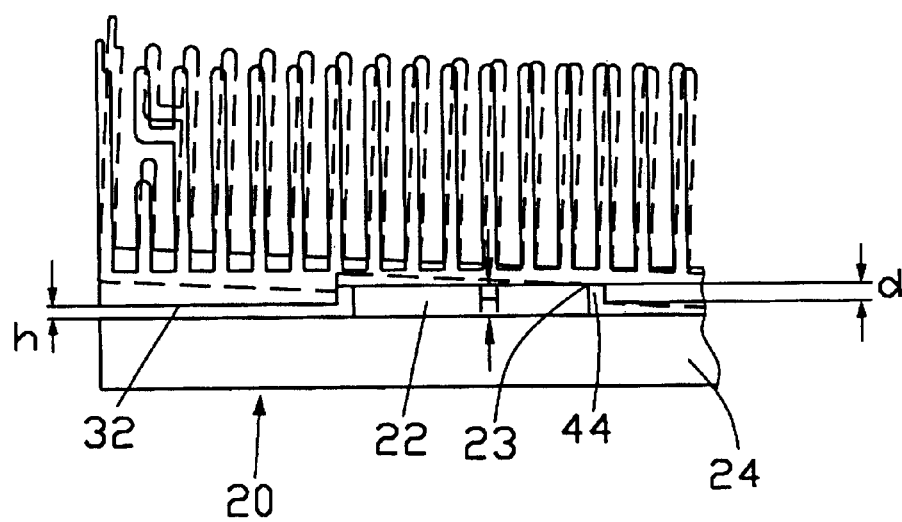
FIG. 5 is a schematic view showing the procedure for mounting the heat sink to the flip chip processor.

Also referring to FIG. 5, the heat sink 30 is mounted on the flip chip processor 20 with the flip chip 22 received in the groove 44. The groove 44 has a width sufficient to completely receive the flip chip 22 therein. The protrusion 46 of the heat sink 30 is inserted in a space formed between an edge of the substrate 24 of the flip chip processor 20 and a raised portion 54 of the socket 52 with the raised portion 54 received in the cutout 48 for properly positioning the heat sink 30 with respect to the flip chip processor 20.

Since the distance h which the heat sink 30 is rotated about a die edge 23 of the flip chip 22 is equal to the depth d of the groove 44 subtracted from the height H of the flip chip 22, thus resulting in a relatively shorter rotation path (angle) in comparison with the prior art having a flat undersurface, the die edge 23 of the flip chip 22 of the present invention is subject to a relatively light load or the shorter term load exerted by the base 32 of the heat sink 30 as compared to the prior art thereby effectively preventing the flip chip 22 from being damaged. Furthermore, since the elongate protrusion 46 of the base 32 is inserted into the space between the substrate 24 of the chip flip processor 20 and the raised portion 54 of the socket connector 52, the heat sink 30 can be properly and readily mounted to the flip chip processor 20.

Figure 6:
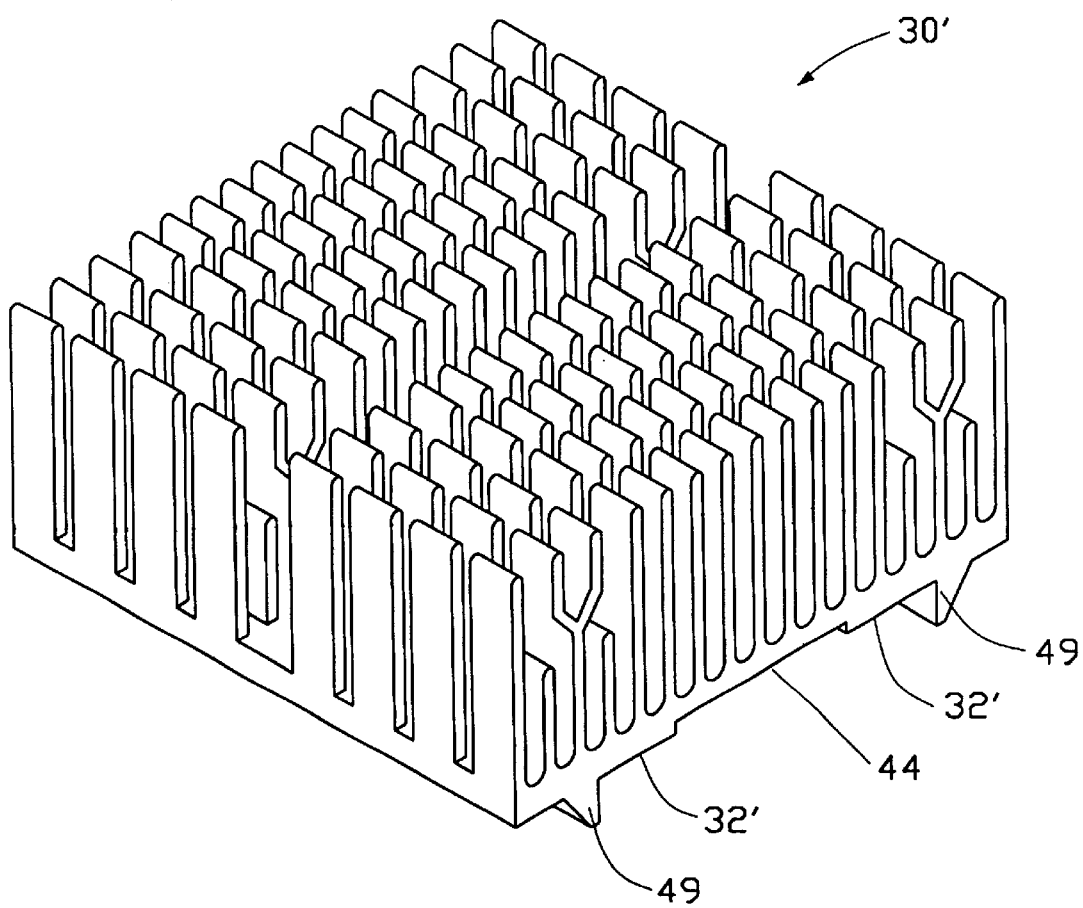
FIG. 6 is a perspective view of a heat sink in accordance with a second embodiment of the present invention.

FIG. 6 illustrates a heat sink 30' in accordance with a second embodiment of the present invention. The heat sink 30' is substantially the same as the heat sink 30 discussed with reference to FIGS. 3–5. The heat sink 30' includes a base 32' having a flat bottom face with a groove 44 defined therein. A pair of elongate ribs 49 extends from the bottom face of the base 32' on opposite sides of and substantially parallel to the groove 44 for receiving the substrate 24 therebetween with the ribs 49 abutting against opposite edges of the substrate 24 of the flip chip processor 20.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:

a socket;

a flip chip processor positioned on the socket with a flip chip somewhat extending above a top surface of a substrate thereof;

a heat sink positioned on the flip chip processor, said heat sink including a base having a bottom surface thereof, said bottom surface defining an offset structure thereof and forming a downward protrusion sandwiched between an edge of the substrate of the flip chip processor and a raised portion of the socket for properly positioning the heat sink with respect to the flip chip processor; wherein a first distance between a top surface of the flip chip and the top surface of the flip chip processor is larger than a second distance between the bottom surface of the base and the top surface of the flip chip processor so as to result in a relatively shorter rotation path pivotal about an edge of the flip chip during installation of the heat sink to the socket.

* * * * *